(12) United States Patent
Thies et al.

(10) Patent No.: US 6,285,308 B1
(45) Date of Patent: Sep. 4, 2001

(54) ANALOG-TO-DIGITAL CONVERTING DEVICE WITH A CONSTANT DIFFERENTIAL NON-LINEARITY

(75) Inventors: William Thies, Belbuef; Herve J. F. Marie, Ver sur Mer, both of (FR)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/531,941

(22) Filed: Mar. 21, 2000

(30) Foreign Application Priority Data

Mar. 23, 1999 (FR) .................................................. 99 03598

(51) Int. Cl.[7] .................................................. H03M 1/12
(52) U.S. Cl. .......................................... 341/155; 341/159
(58) Field of Search ..................................... 341/155, 159

(56) References Cited

U.S. PATENT DOCUMENTS

| | | | |
|---|---|---|---|
| 4,831,379 | * | 5/1989 | Plassche .................................. 341/159 |
| 5,835,047 | * | 11/1998 | Vorenkamp et al. ................. 341/155 |
| 5,856,800 | * | 1/1999 | Pailleur et al. ....................... 341/155 |

OTHER PUBLICATIONS

"An 8–Bit Video ADC Incorporating Folding and Interpolation Techniques", By Rob van de Grift et al., IEEE Journal of Solid–State Circuits, vol. SC22, No. 6, Dec. 1987, pp. 944–953.

* cited by examiner

*Primary Examiner*—Trong Phan
(74) *Attorney, Agent, or Firm*—Steven R. Biren

(57) ABSTRACT

The present invention relates to a converting device for converting an analog input signal Vin into a digital output signal OUT, whose gain is equal to the ratio between the values of the output and input signals, comprising: a resistor ladder LAD intended to generate reference voltages, and a plurality of amplifiers A, intended to compare the input signal Vin with the reference voltages. According to the invention, the converting device includes adjusting means for making the gain of the amplifiers and the gain of the converting device proportional to each other. The invention enables to ensure that the differential non-linearity of the converting device remains constant and thus that its behavior does not change when its gain varies.

4 Claims, 2 Drawing Sheets

ANALOG-TO-DIGITAL CONVERTING DEVICE WITH A CONSTANT DIFFERENTIAL NON-LINEARITY

BACKGROUND OF THE INVENTION

The present invention relates to a converting device intended to convert an analog input signal into a digital output signal, having a gain defined as being equal to the ratio between the values of the output and input signals, the device comprising:

- a resistor ladder arranged in series between two supply terminals, intended to generate reference voltages,
- a plurality of amplifiers, each being intended to deliver an output signal that results from the amplification of a difference between the analog input signal and one of the reference voltages,
- a detection stage intended to signal zero-crossings of each of the output signals of said amplifiers, and
- a binary encoder intended to deliver the output signal whose value depends on said zero-crossings.

Such devices are known from the article <<An 8-bit Video ADC Incorporating Folding and Interpolation Techniques>>, by Messrs. van de Grift, Rutten and van der Veen, published in IEEE Journal of Solid-State Circuits, vol. SC-22, no. 6, December 1987. These converting devices have a transfer characteristic that describes the evolution of the value of the digital output signal as a function of that of the analog input signal, which transfer characteristic takes the form of a staircase. In an ideal converting device each step of the staircase has a center point whose abscissa corresponds to the value of one of the reference voltages, each center point being in a position to be connected to all the others by the same straight line. It is thus observed that the transfer characteristic of an ideal converting device is linear. In real converting devices, deviations relative to this linearity may occur. For modeling the behavior of the known converting devices and characterizing said deviations, one frequently uses a parameter called "differential non-linearity", defined as being equal to the deviation relative to unity, represented by the least significant bit of the digital output signal, which is shown by the difference between the results of two successive conversions during which the analog input voltage will have taken the value of two successive reference voltages.

An ideal converting device thus has a differential non-linearity equal to zero at any point of its transfer characteristic. If in a real converting device the transfer characteristic shows at a point a non-zero differential non-linearity, said characteristic will show a missing code which is symptomatic of a conversion error.

The gain of the converting devices described above may be expressed in the form of the ratio between the maximum value of the output signal of the converter device and the value of the voltage present on the terminals of the resistor ladder. This gain may be caused to vary, depending on the operating conditions of the converting device. Indeed, it is common practice to make the maximum value of the digital output signal correspond to the maximum value the analog input signal may take, so as to fully use the range of values available for the output signal, which leads to an optimum resolution of the conversion carried out by the device.

SUMMARY OF THE INVENTION

It has been found that the differential non-linearity depends on the gain of the converting device. This implies that this parameter is bound to vary as a function of the operating conditions of the converting device, which implies that its behavior is unpredictable. Such an uncertainty is unacceptable.

It is an object of the present invention to remedy this drawback by proposing a converting device whose differential non-linearity is constant.

Studies made by the applicants have indeed enabled to demonstrate that the differential non-linearity, denoted DNL, may be expressed in the form of:

DNL=VDET.GADC/GA, where VDET is an offset voltage introduced by the detection stage, GADC is the gain of the converting device and GA is the gain of the amplifiers.

The present invention proposes a converting device as defined in the opening paragraph, characterized in that it includes adjusting means for making the gain of the amplifiers and the gain of the converting device proportional to each other.

In such a converting device, the differential non-linearity is proportional to the offset voltage VDET introduced by the detection stage. As this offset voltage is fixed and intrinsic of the structure of the detection stage, the differential non-linearity is constant and the behavior of the converting device is predictable, whatever its operating conditions. Moreover, by optimizing the design of the detection stage, it is possible to minimize the value of this offset voltage. In the converting device according to the invention, this minimization is reflected in the value of the differential non-linearity, which reduces to a minimum the risk for conversion errors to occur.

In a particular embodiment of the invention, a converting device as described above is characterized in that:

- the adjusting means comprise a first current source arranged in series with the resistor ladder and intended to produce a current whose value is proportional to the value of a control signal, and in that
- each amplifier has an adjusting input intended to receive the control signal, while the gain of each amplifier is proportional to the value of the signal received on its adjusting input.

This embodiment is advantageous in that it enables to easily modify the gain of the converting device and simultaneously adjust the gain of the amplifiers, so that these gains remain proportional to each other. The amplifiers may be realized in various forms, such as, for example, in the form of Gilbert cells, each intended to multiply the difference between the input signal and one of the reference voltages by the control signal.

An embodiment which is particularly advantageous in its simplicity presents a converting device as described above, characterized in that the amplifiers are formed by differential pairs, all biased by means of mutually identical current sources, each being intended to produce a current whose value is proportional to the value of the control signal.

In this embodiment, the control signal influences elements of the same kind; in this case the current sources. The control signal may thus be used inside the amplifiers, without being subjected to a particular transformation. In contrast, using Gilbert cells for building amplifiers, or, more generally, using voltage multipliers will require a conversion of the control signal into an analog voltage.

In a preferred embodiment of the invention, a converting device as described above is characterized in that the adjusting means further include a comparator intended to carry out a comparison between the value of the output signal and a predetermined value when the input signal takes a value called calibration value, and to produce the control signal whose value depends on the result of said comparison.

This structure of the adjusting means enables to easily adjust the maximum digital value of the output signal to the maximum value of the analog input signal, represented by the calibration signal, and thus enables to obtain an optimum resolution for the conversion performed by the device whose behavior remains predictable thanks to the invention.

BRIEF DESCRIPTION OF THE DRAWING

These and other aspects of the invention are apparent from and will be elucidated, by way of non-limiting example, with reference to the embodiments described hereinafter.

DESCRIPTION OF PREFERRED EMBODIMENTS

Figure 1:
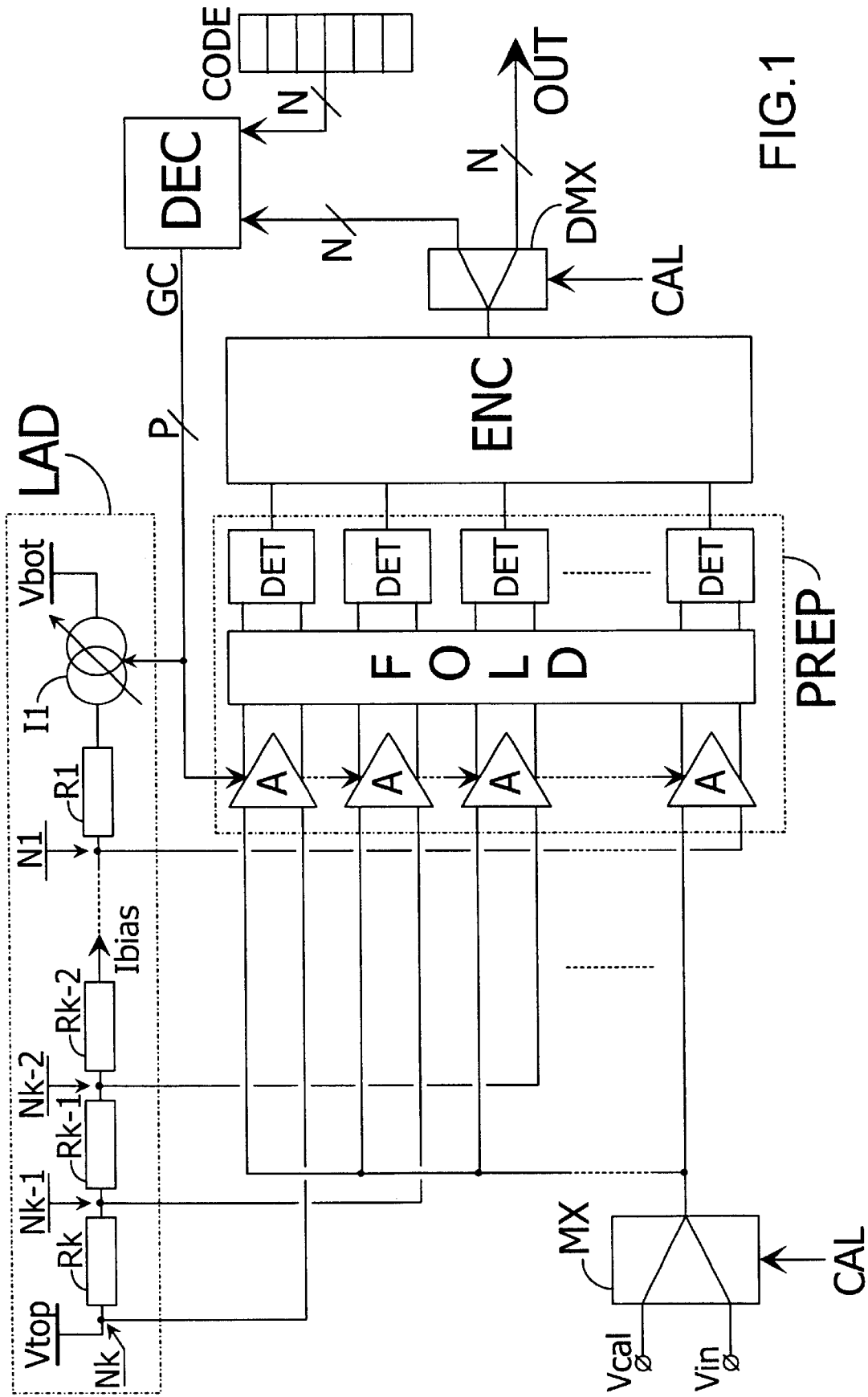
FIG. 1 is a functional diagram describing a converting device in accordance with a preferred embodiment of the invention.

FIG. 1 schematically represents a converting device according to a preferred embodiment of the invention, intended to convert an analog input signal Vin into a digital output signal OUT, coded in N bits. This device comprises a ladder LAD of k resistors (R1, . . . , Rk), arranged in series between two power supply terminals Vtop and Vbot intended to generate reference voltages (V1, . . . , Vk) tapped from intermediate nodes (N1, . . . , Nk) formed by the terminals of the resistors (R1, . . . , Rk). In this embodiment of the invention, the converting device comprises a preprocessing stage PREP of the analog input signal Vin, which stage includes:

a plurality of amplifiers A, each being intended to produce an output signal resulting from the amplification of a difference between the analog input signal Vin and one of the reference voltages (V1, . . . , Vk), and a detection stage, comprising a plurality of memory flip-flops DET, and intended to spot zero-crossings of each of the output signals of said amplifiers A.

The preprocessing stage PREP described here further includes, inserted between the amplifiers A and the detection stage DET, a folding stage FOLD which is intended to combine the output signals of the amplifiers A according to a technique well known to those skilled in the art and notably described in the article to which reference is made above. The converting device finally comprises a binary encoder ENC intended to produce the output signal OUT, whose value depends on zero-crossings of the output signals of the amplifiers A detected by the detection stage and identified by the contents of the memory flip-flops DET.

The converting device includes adjusting means for making the gain of the amplifiers A, called GA, and the gain of the converting device, called GADC, proportional to each other. These adjusting means comprise a first current source I1, arranged in series with the resistor ladder (R1, . . . , Rk), and intended to supply a current Ibias whose value is proportional to the value of a control signal GC. Each amplifier A has an adjusting input intended to receive the control signal GC, while the gain of each amplifier A is proportional to the value of the signal received on its adjusting input. In this preferred embodiment of the invention, the adjusting means further include a comparator DEC intended to perform a comparison between the value of the output signal OUT and a predetermined value CODE when the input signal takes a calibration value, and to deliver the control signal GC whose value depends on the result of said comparison.

This structure of the adjusting means enables to easily adjust the value of the gain GADC of the converting device while keeping the differential non-linearity constant. In order to use the whole range of available values of the output signal OUT, one will preferably choose for the predetermined value CODE the maximum digital value of the output signal, and for the calibration value the maximum value that may be taken by the analog input signal Vin. Such a choice enables to obtain an optimum resolution for the conversion performed by the device. In this preferred embodiment of the invention, the adjustment of the gain GADC of the converting device is performed as follows: during a calibration phase, a signal CAL becomes active and instructs a multiplexer MX to substitute a calibration signal Vcal having a constant value equal to the calibration value for the analog input signal Vin. Each amplifier A amplifies a difference between this calibration signal Vcal and one of the reference voltages (V1, . . . , Vk) generated at the nodes (N1, . . . , Nk) of the resistor ladder LAD. Zero-crossings of the output signals of the amplifiers A are detected by the detection stage. The preprocessing module PREP thus performs as it were a comparison of the calibration signal Vcal with each one of the reference voltages (V1, . . . , Vk). The result of this comparison is coded by a binary encoder ENC which delivers the output signal OUT, coded in N bits, of the converting device. During the calibration phase the signal CAL instructs a demultiplexer DMX to route the result of the conversion of the calibration signal Vcal to a comparator DEC, which compares said result with a predetermined value CODE previously stored in a digital register. If, for example, the result of the conversion is lower than the predetermined value CODE, this means that the maximum value the analog input signal Vin may take is lower than the largest of the reference voltages, in this case Vk, and that the largest codes are not used, that is to say, that the resolution of the conversion may be improved. The comparator DEC then delivers a signal GC whose value is such that it instructs a reduction of the current Ibias supplied by the first current source I1, which will result in a diminishing of the values of the reference voltages (V1, . . . , Vk) by the application of Ohm's law. This diminishing will continue until the result of the conversion of the calibration signal Vcal is equal to the predetermined value CODE, which will be equivalent to saying that the calibration value is then equal, in the example described here, to the largest value of the reference voltages Vk, which enables to obtain optimum resolution for the conversion.

The differential non-linearity of a known converting device depends on the gain GADC of the device, which may be expressed in the form $GADC=(2^N-1)/(Vtop-Vbot)$, or also $GADC=(2^N-1)/Nk$. The gain adjustment described above thus modifies the behavior of the known device in a manner that is hard to predict. The fact that in the converting device according to the invention each amplifier A has an adjusting input intended to receive the control signal GC, and that the gain GA of each amplifier A is proportional to the value of the signal received on its adjusting input, enables to ensure that the differential non-linearity of the device remains constant, whatever the effected gain adjustment, and that the behavior of the converting device remains predictable, because the differential non-linearity marked DNL is equal to VDET.GADC/GA, where VDET is an offset voltage introduced by the detection stage.

Figure 2:
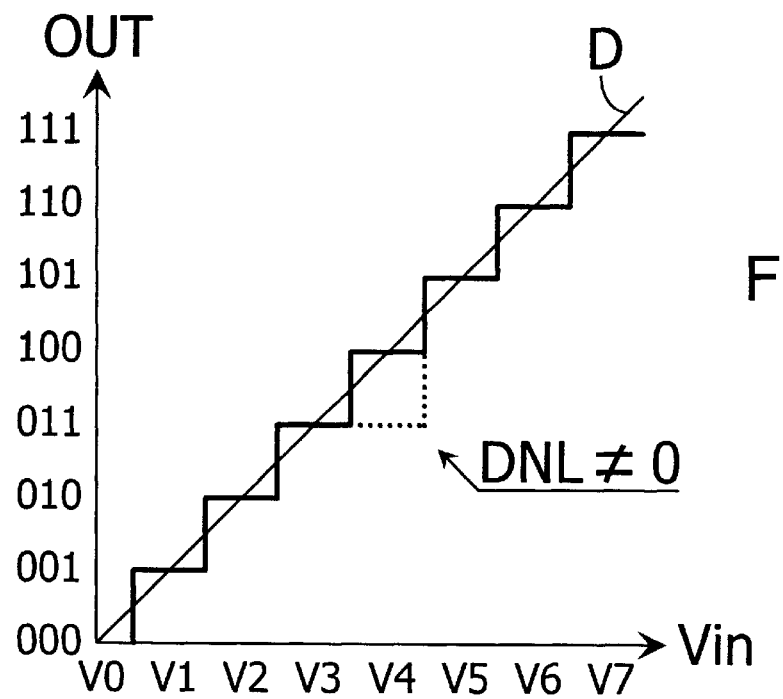
FIG. 2 is a graph describing the transfer characteristic of a converting device.

FIG. 2 is a transfer characteristic which describes the evolution of the value of the digital output signal OUT as a function of that of the analog input signal Vin, which characteristic takes the form of a staircase. In order to simplify the Figure, the signal OUT is here chosen to be coded in 3 bits (N=3). In an ideal converting device, each step of the staircase has a center point whose abscissa corresponds to the value of one of the reference voltages Vj (for j=0 to 7), being eight in this example, while the voltages V1 to V7 are generated by the resistor ladder, and the voltage V0 is delivered by the ground of the converting device. Each center point may be connected to all the others by a same straight line D. It is thus observed that the transfer characteristic of an ideal converting device is linear. In real converting devices, deviations from this linearity may occur. Such a deviation is represented in a dotted line in the Figure. At this point of the transfer characteristic, the real converting device shows a differential non-linearity DNL different from zero, and said characteristic presents a missing code, in this case the code 100, which represents a conversion error since a same value of the output signal OUT, in this case 011, results from the conversion of two different values, here V3 and V4, of the input signal Vin. Consequently, the differential non-linearity DNL is representative of the behavior of the converting device. For this behavior to be predictable, the differential non-linearity DNL is to remain constant whatever the operating conditions of the converter device, and, more particularly, whatever the value of its gain, as is explained above. This is obtained in the converting device according to the invention described in the preceding Figure.

Figure 3:
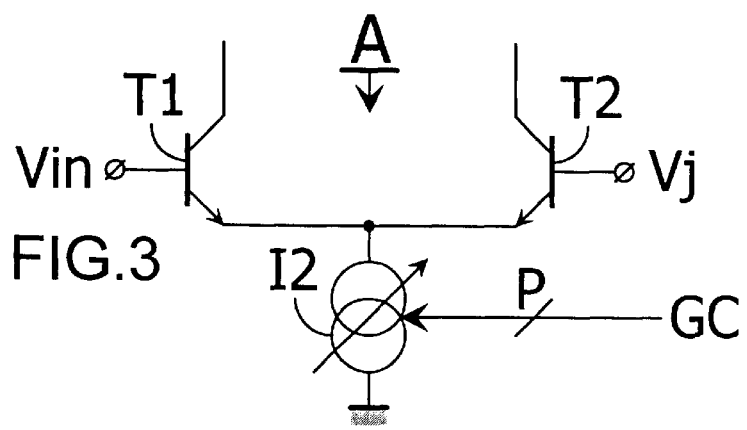
FIG. 3 is a partial electrical diagram describing one of the amplifiers included in a converting device according to a particular embodiment of the invention.

FIG. 3 represents one of the amplifiers A included in a particular embodiment of the invention. Each of these amplifiers A is formed by two transistors (T1, T2) whose bases are intended respectively to receive the analog input signal Vin and one of the reference voltages Vj (for j=1 to k), while said transistors form a differential pair biased by the current source 12, intended to supply a current whose value is proportional to the value of the control signal GC. The output signal of this amplifier A may be tapped from the collector of either transistor (T1, T2) if one wishes to have an asymmetrical signal, or between the collectors of said transistors (T1, T2) if one wishes to have a differential signal. In this particular embodiment of the invention, the control signal GC influences elements of the same type, in this case the first current source I1 and the current sources I2 of the amplifiers. The control signal GC may thus be used within the amplifiers A, without undergoing a particular transformation. Although it is suitable to construct the amplifiers A in the form of Gilbert cells or, more generally, in the form of voltage multipliers, such an embodiment would be less advantageous for it would necessitate a conversion into an analog voltage of the control signal GC, and at least two additional differential pairs for each amplifier A, which would be intended to multiply the output signal of the first differential pair (T1, T2) by the result of this conversion of the control signal GC.

Figure 4:
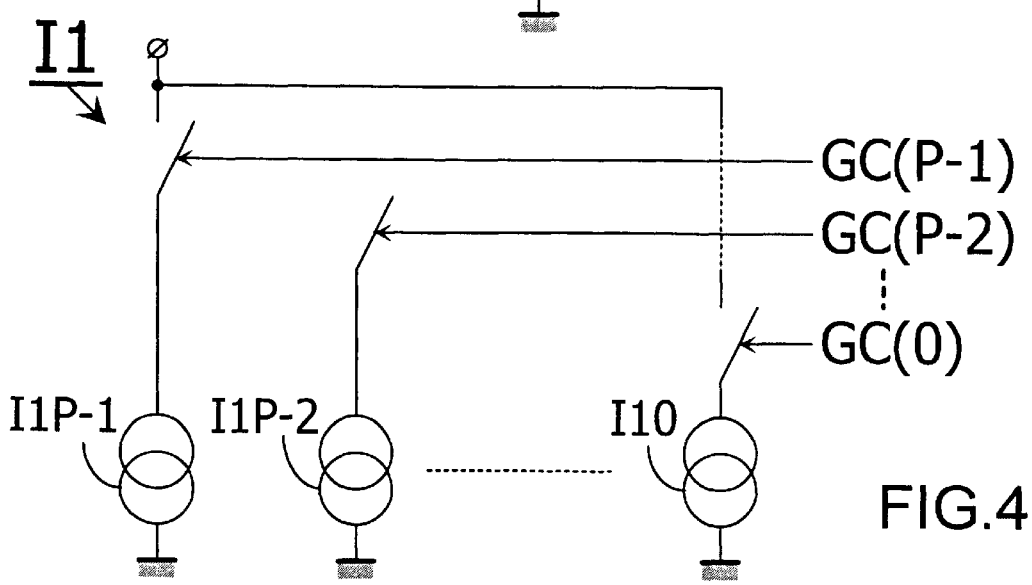
FIG. 4 is an electrical diagram describing a current source included in a converting device according to a particular embodiment of the invention.

FIG. 4 represents an embodiment of the first current source I1. The control signal GC being a digital signal coded in P bits (GC(0), ..., GC(P−1)), the first current source I1 comprises P current sources (I10 ... I1P−1), each activated by means of a switch controlled by one of the bits of the control signal GC. The P current sources (I10 ... I1 P−1) may be constructed in such a way as to supply all the same nominal current 10. In a variant of this embodiment, one can choose to assign weighted values to the currents supplied by these sources: I1i=2.I0, for i=0 to P−1. This will enable to assign different weights to the various bits of the control signal GC. The use of similar structures to that described above for realizing the current sources intended to bias the differential pairs that form the amplifiers A described in the previous Figure enables to obtain a proportionality between the gain GADC of the converting device and the gain GA of the amplifiers, and thus a constant differential non-linearity, in a simple and cost-effective manner, whatever the variations of the gain GADC of the converting device.

What is claimed is:

1. A converting device intended to convert an analog input signal into a digital output signal, having a gain defined as being equal to the ratio between the values of the output and input signals, the device comprising:

a resistor ladder arranged in series between two supply terminals, intended to generate reference voltages, a plurality of amplifiers, each being intended to deliver an output signal that results from the amplification of a difference between the analog input signal and one of the reference voltages, a detection stage, intended to signal zero-crossings of each of the output signals of said amplifiers, and a binary encoder, intended to deliver the output signal whose value depends on said zero-crossings, which device is characterized in that it includes adjusting means for making the gain of the amplifiers and the gain of the converting device proportional to each other.

2. A converting device as claimed in claim 1, characterized in that:

the adjusting means comprise a first current source arranged in series with the resistor ladder and intended to produce a current whose value is proportional to the value of a control signal, and in that each amplifier has an adjusting input intended to receive the control signal, while the gain of each amplifier is proportional to the value of the signal received on its adjusting input.

3. A converting device as claimed in claim 2, characterized in that the amplifiers are formed by differential pairs, all biased by current sources which are identical to each other, each being intended to supply a current whose value is proportional to the value of the control signal.

4. A converting device as claimed in claim 2, characterized in that the adjusting means further include a comparator intended to perform a comparison between the value of the input signal takes a calibration value and on the result of said comparison.

* * * * *